(12) United States Patent
Gizdarski et al.

(10) Patent No.: US 12,282,063 B1
(45) Date of Patent: Apr. 22, 2025

(54) SCAN CHAIN FORMATION FOR IMPROVING CHAIN RESOLUTION

(71) Applicant: Synopsys, Inc., Sunnyvale, CA (US)

(72) Inventors: Emil Gizdarski, Cupertino, CA (US); Fadi Maamari, Mountain View, CA (US)

(73) Assignee: Synopsys, Inc., Sunnyvale, CA (US)

( * ) Notice: Subject to any disclaimer, the term of this patent is extended or adjusted under 35 U.S.C. 154(b) by 29 days.

(21) Appl. No.: 18/531,548

(22) Filed: Dec. 6, 2023

Related U.S. Application Data

(60) Provisional application No. 63/431,158, filed on Dec. 8, 2022.

(51) Int. Cl.
*G01R 31/3185* (2006.01)

(52) U.S. Cl.
CPC .......... *G01R 31/318536* (2013.01); *G01R 31/318541* (2013.01); *G01R 31/31855* (2013.01)

(58) Field of Classification Search
CPC .... G01R 31/318536; G01R 31/318541; G01R 31/31855
USPC .................................................. 714/726, 729
See application file for complete search history.

(56) References Cited

U.S. PATENT DOCUMENTS

| | | | | |
|---|---|---|---|---|
| 9,977,080 | B2 * | 5/2018 | Guo | G01R 31/318569 |
| 2004/0218454 | A1 * | 11/2004 | Gorman | G11C 29/802 |
| | | | | 365/225.7 |
| 2008/0215943 | A1 * | 9/2008 | Guo | G01R 31/318525 |
| | | | | 714/729 |
| 2012/0216088 | A1 * | 8/2012 | Guo | G01R 31/3177 |
| | | | | 714/E11.155 |
| 2016/0125957 | A1 * | 5/2016 | Hou | G11C 29/32 |
| | | | | 714/719 |
| 2017/0254851 | A1 * | 9/2017 | Huott | G01R 31/31723 |
| 2024/0393394 | A1 * | 11/2024 | Yang | G01R 31/318536 |

OTHER PUBLICATIONS

Wang et al., A Design-for-Diagnosis Technique for Diagnosing both Scan Chain Faults and Combinational Circuit Faults, 2008, IEEE, pp. 571-576. (Year: 2008).*
Lo et al., Utilizing Circuit Structure for Scan Chain Diagnosis, 2013, IEEE, pp. 1-6. (Year: 2013).*

* cited by examiner

*Primary Examiner* — John J Tabone, Jr.
(74) *Attorney, Agent, or Firm* — Patterson + Sheridan, LLP

(57) ABSTRACT

The present disclosure describes systems and methods for forming scan chains. The system includes a memory and a processor communicatively coupled to the memory. The processor receives a circuit design that includes a plurality of scan cells. The plurality of scan cells includes a first scan cell and a first set of scan cells coupled logically to the first scan cell. The processor forms the plurality of scan cells into a first scan chain such that the first set of scan cells are placed outside an extended neighborhood of the first scan cell. The extended neighborhood of the first scan cell includes (i) scan cells that are downstream of the first scan cell in the first scan chain and (ii) a scan cell that is adjacent to and upstream of the first scan cell in the first scan chain.

20 Claims, 15 Drawing Sheets

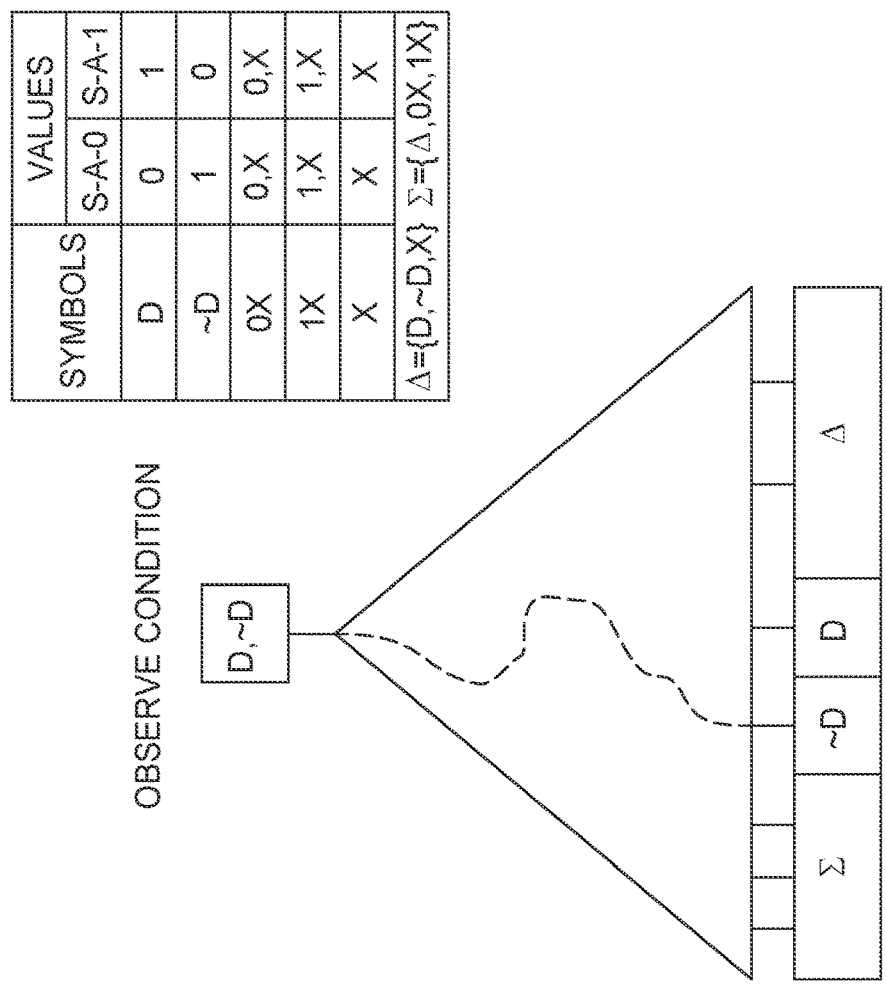
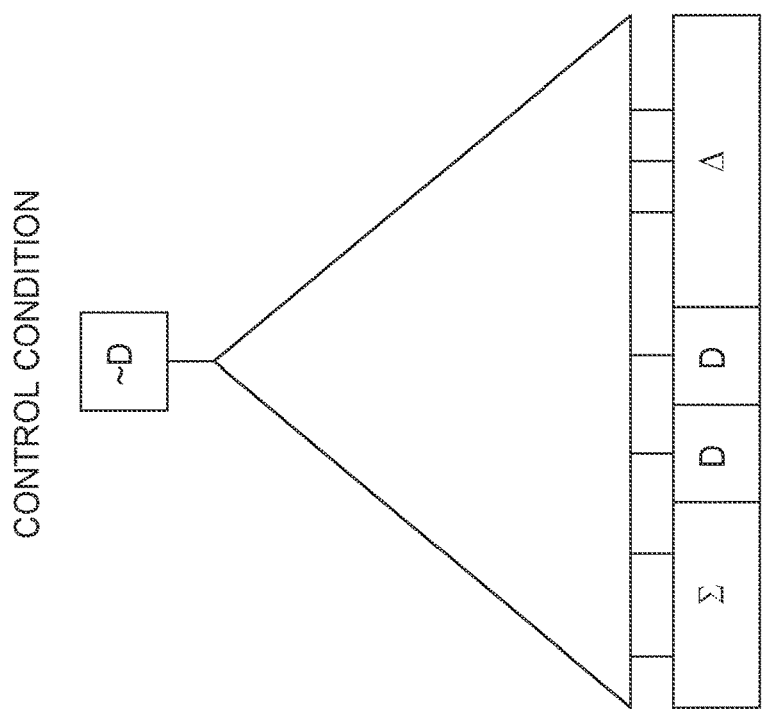
FIG. 1A

| C2 | ... | C1 | ... | B | A | |

TUPLE: {A, B, C1, C2}

A: CONDITIONAL OBSERVE POINT (A, B) ⟶ DISTINGUISHABLE WITH INVERTER ADDED

FIG. 6

SCAN CHAIN FORMATION FOR IMPROVING CHAIN RESOLUTION

RELATED APPLICATION

This application claims priority to and the benefit of U.S. Provisional Patent Application Ser. No. 63/431,158, entitled "TUPLES FOR IMPROVING CHAIN RESOLUTION" filed Dec. 8, 2022, which is incorporated herein by reference in its entirety.

TECHNICAL FIELD

The present disclosure relates to circuit fault detection. Specifically, the present disclosure relates to forming a scan chain to improve defect localization in the scan chain.

BACKGROUND

A scan chain is used to detect faults (e.g., stuck-at-0 or stuck-at-1 faults that may be caused by open or short circuits) in a circuit design. The scan chain is formed using a series of scan cells (e.g., registers) dispersed throughout the circuit design. When the scan chain is enabled, the scan cells are connected into a single shift register. Test stimulus (values) may then be shifted through the scan cells. When the scan chain is subsequently disabled, the test stimulus in the scan cells feed into the other components of the circuit design (e.g., combinational logic) and the test response is captured by the scan cells. Next, the scan chain is enabled again and the test response is shifted out from the scan cells and the next test stimulus is shifted into the scan cells. The test response may then be evaluated to determine whether there are faults in the circuit design (e.g., stuck-at-0 or stuck-at-1 faults that may be caused by open or short circuits). Thus, this process allows the circuit design to be tested with a desired set of test stimulus shifted into the scan chain.

SUMMARY

The present disclosure describes systems and methods for forming scan chains. According to an embodiment, a system for forming a scan chain includes a memory and a processor communicatively coupled to the memory. The processor receives a circuit design that includes a plurality of scan cells. The plurality of scan cells includes a first scan cell and a first set of scan cells coupled logically to the first scan cell. The processor forms the plurality of scan cells into a first scan chain such that the first set of scan cells are placed outside an extended neighborhood of the first scan cell. The extended neighborhood of the first scan cell includes (i) scan cells that are downstream of the first scan cell in the first scan chain and (ii) a scan cell that is adjacent to and upstream of the first scan cell in the first scan chain.

The plurality of scan cells may include a second scan cell and a second set of scan cells coupled logically to the second scan cell. A third scan cell of the second set of scan cells may be adjacent to and upstream of the second scan cell in the first scan chain. Forming the plurality of scan cells into the first scan chain may include adding an inverter between the third scan cell and the second scan cell.

The plurality of scan cells may include a second scan cell and a third scan cell. Forming the plurality of scan cells into the first scan chain may include adding a multiplexer between the second scan cell and the third scan cell.

Forming the plurality of scan cells into the first scan chain may include setting an order of the first set of scan cells in the circuit design.

The processor may calculate a score for the first scan chain based on the first set of scan cells being placed outside the extended neighborhood of the first scan cell. The processor may select the first scan chain from a plurality of scan chains based on the score for the first scan chain. The score may be based on a chain resolution of the first scan chain. The score may be further based on at least one of wire length or power consumption in the circuit design.

According to another embodiment, a method of forming a scan chain includes receiving a circuit design comprising a plurality of scan cells. The plurality of scan cells includes a first scan cell and a first set of scan cells coupled logically to the first scan cell. The method also includes forming, by a processor, the plurality of scan cells into a first scan chain such that the first set of scan cells are placed outside an extended neighborhood of the first scan cell. The extended neighborhood of the first scan cell includes (i) scan cells that are downstream of the first scan cell in the first scan chain and (ii) a scan cell that is adjacent to and upstream of the first scan cell in the first scan chain.

The plurality of scan cells may include a second scan cell and a second set of scan cells coupled logically to the second scan cell. A third scan cell of the second set of scan cells may be adjacent to and upstream of the second scan cell in the first scan chain. Forming the plurality of scan cells into the first scan chain may include adding an inverter between the third scan cell and the second scan cell.

The plurality of scan cells may include a second scan cell and a third scan cell. Forming the plurality of scan cells into the first scan chain may include adding a multiplexer between the second scan cell and the third scan cell.

Forming the plurality of scan cells into the first scan chain may include setting an order of the first set of scan cells in the circuit design.

The method may include calculating a score for the first scan chain based on the first set of scan cells being placed outside the extended neighborhood of the first scan cell. The method may include selecting the first scan chain from a plurality of scan chains based on the score for the first scan chain. The score may be based on a chain resolution of the first scan chain. The score may be further based on at least one of wire length or power consumption in the circuit design.

According to another embodiment, a non-transitory computer readable medium stores instructions for forming a scan chain that, when executed by a processor, cause the processor to receive a circuit design comprising a scan chain, determine a first scan cell of the scan chain and a second scan cell of the scan chain, and adjust an order of the scan chain such that the second scan cell is placed outside an extended neighborhood of the first scan cell. The extended neighborhood of the first scan cell includes (i) scan cells that are downstream of the first scan cell in the scan chain and (ii) a scan cell that is adjacent to and upstream of the first scan cell in the first scan chain.

The instructions may further cause the processor to determine a third scan cell of the scan chain and a fourth scan cell of the scan chain and add an inverter between the third scan cell and the fourth scan cell.

The instructions may further cause the processor to determine a third scan cell of the scan chain and a fourth scan cell of the scan chain and add a multiplexer between the third scan cell and the fourth scan cell.

The instructions may further cause the processor to calculate a score for the scan chain based on the second scan cell being placed outside the extended neighborhood of the first scan cell.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1A illustrates an example automatic test pattern generation model.

FIG. 6 illustrates an example scan chain.

DETAILED DESCRIPTION

Figure 1B:
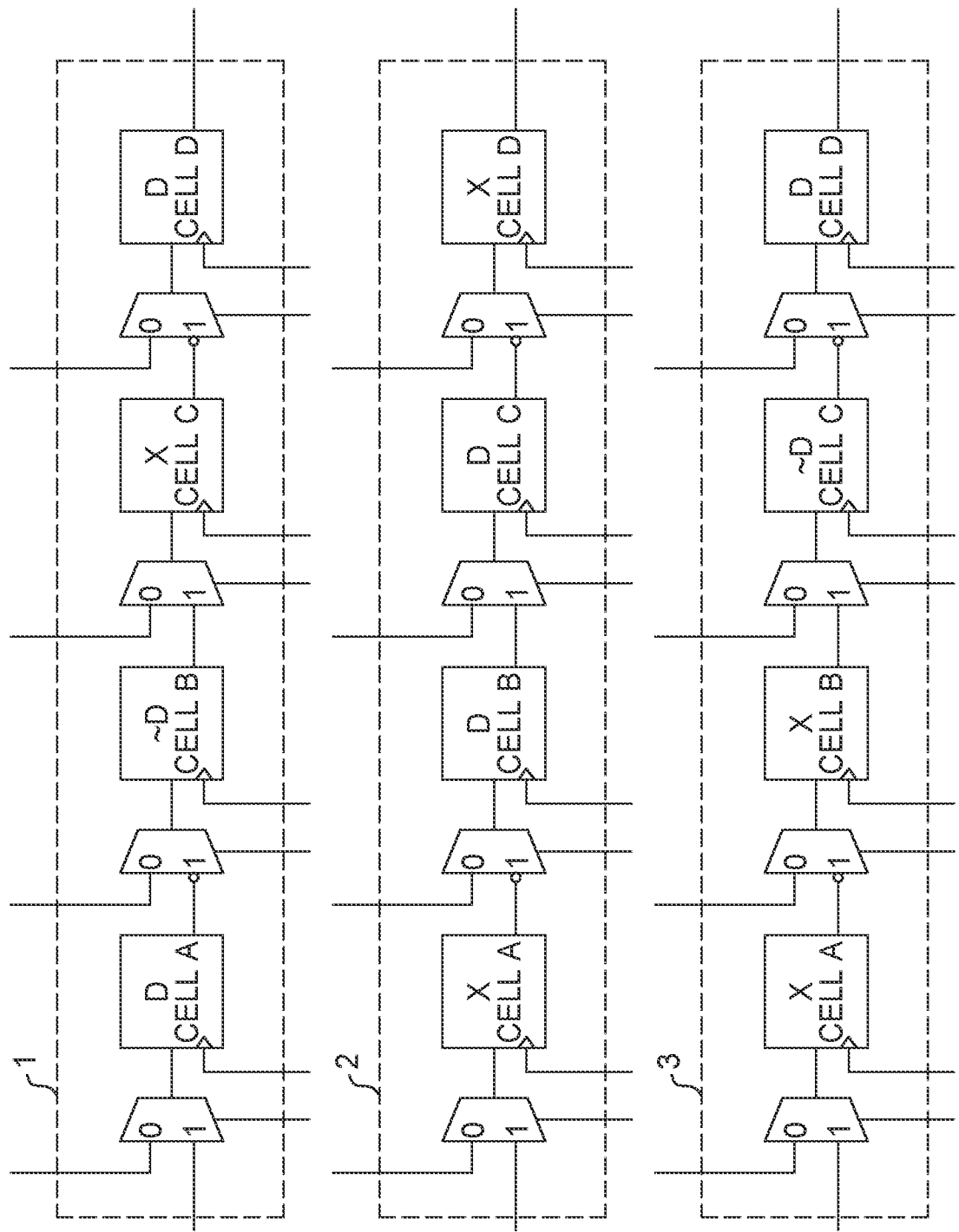
FIG. 1B illustrates an example merging process of D-cubes.

Although it may be straightforward to determine if a scan chain is faulty, it is more challenging to determine which scan cell in a scan chain is faulty. In some instances, it may be possible to determine a range of scan cells of the scan chain in which the defect may be occurring. Chain resolution is a metric that refers to how small this range is. The greater the chain resolution, the smaller the range, with a 100% chain resolution indicating that a faulty scan cell can always be located. Accordingly, the faulty scan cell is uniquely located or distinguishable from its upstream adjacent scan cell and downstream adjacent scan cell in a scan chain, respectively. To improve chain resolution, the computer systems add circuit components to the scan chain that help in locating the faulty scan cells in a scan chain. For example, the computer systems add multiplexers between scan cells in a scan chain. As another example, the computer systems add inverters between scan cells in the scan chain. These components, however, also increase the size and power consumption of the circuit design, which may be undesirable. As another example, the computer systems disable clock gating circuits when the scan chain is capturing a test response, which may have an undesirable impact on the circuit design. In some instances, these techniques may not guarantee 100% chain resolution.

The present disclosure describes a circuit design process that helps in locating faulty scan cells in a scan chain. The process involves forming the scan cells into scan chains so that scan cells in a scan chain that provide inputs (or input scan cells) to another scan cell in the scan chain are placed outside an extended neighborhood of the said another scan cell. The extended neighborhood of the said another scan cell includes scan cells of the scan chain that are downstream of the said another scan cell. The extended neighborhood also includes the scan cell that immediately precedes (or is adjacent to and upstream of) the said another scan cell in the scan chain. When the input scan cells of the said another scan cell are placed outside of the extended neighborhood of the said another scan cell, it becomes possible to exclude (or reject) the said another scan cell as a potential fault location. By applying this process for multiple scan cells in the scan chain, it is possible to locate faults in more scan cells in the scan chain, improving a metric called chain resolution.

In certain embodiments, the circuit design process provides several technical advantages. For example, the circuit design process improves chain resolution without adding circuit components (e.g., inverters and/or multiplexers) to the scan chain. Adding these components in addition to performing the circuit design process may further improve chain resolution. As a result, the circuit design process reduces the size of the circuit design relative to existing processes, and the circuit design process reduces the power consumption of the circuit design relative to existing processes.

Existing processes use a set of design modifications that provide a unique localization of any single chain defect. These design modifications include: A) disabling clock gating cells to ensure capture operation (a type-1 design modification), B) inserting inverters in the scan chain path (a type-2 design modification) and C) inserting control-points and observe-points (a type-3 design modification). Stuck-at faults of a pair of adjacent scan cells is distinguishable if a load value of the adjacent upstream scan cell is directly observable at a downstream scan cell of the adjacent downstream scan cell (or observe-point) or a capture value of the adjacent downstream scan cell is directly controllable by an upstream scan cell of the adjacent upstream scan cell (or control-point). Stated differently, observing fault-free (or expected) load value from the adjacent upstream scan cell of a faulty scan cell is evidence that the adjacent upstream scan cell is fault-free (or not faulty). As a result, the adjacent upstream scan cell may be excluded (or rejected) as a potential fault location. Similarly, unloading fault-free (or expected) capture value from the adjacent downstream scan cell of a faulty scan cell is evidence that the adjacent downstream scan cell is fault-free (or not faulty). As a result, the adjacent downstream scan cell may be excluded (or rejected) as a potential fault location. For example, two indistinguishable pairs of adjacent scan cells in a scan chain such that a first indistinguishable pair is downstream of a second indistinguishable pair become distinguishable by coupling an adjacent upstream cell of the second indistinguishable pair to an adjacent downstream cell of the first indistinguishable pair. Accordingly, the said coupling is performed by adding a multiplexer in the scan path between scan cells of the first indistinguishable pair such that a load value of the adjacent upstream scan cell of the second indistinguishable pair is directly observable at the adjacent downstream scan cell of the first indistinguishable pair and a capture value of the adjacent downstream scan cell of the first indistinguishable pair is directly controllable by the adjacent upstream scan cell of the second indistinguishable pair, respectively. As a result, the adjacent downstream cell of the first indistinguishable pair acts as an observe-point of the adjacent upstream cell of the second indistinguishable pair, and the adjacent upstream cell of the second indistinguishable pair acts as a control-point of the adjacent downstream cell of the first indistinguishable pair, respectively.

Disabling clock gating cells and adding inverters in the scan chain path may increase capture power. Additionally, disabling clock gating cells and inserting control-points and observe-points may add an extra gate or wire. Thus, these modifications may guarantee 100% chain resolution, but they may have a negative impact on area overhead or chip performance.

An automatic test pattern generation (ATPG) model for type-2 design modifications is shown in FIG. 1A. The control condition defines valid values for all symbols for both stuck-at faults in a defective scan cell. Note that the ATPG model excludes the effect of inversions in the scan path (if any). Accordingly, a pair of adjacent scan cells is distinguishable by satisfying either a control condition for an adjacent downstream cell or an observe condition for an adjacent upstream cell, respectively. The control condition includes that the adjacent downstream cell captures value ~D when the adjacent upstream cell (or defective scan cell) has value D and downstream scan cells of the adjacent downstream cell have value D, ~D or X (which represents an unspecified value). Respectively, the upstream scan cells of the adjacent upstream scan cell (or defective scan cell) are unconstrained. The observe condition includes that a load value ~D of the adjacent upstream cell is propagated to a downstream scan cell of the adjacent downstream cell (or defective scan cell) when the adjacent downstream scan cell has value D and its downstream cells have value D, ~D or X. The upstream cells of the adjacent upstream cell are unconstrained. Effectively, the observe condition of the ATPG model ensures observing fault-free (or expected) load values from an adjacent upstream scan cell of a faulty scan cell as well as the control condition of the ATPG model ensures unloading fault-free (or expected) capture values from an adjacent downstream scan cell of the faulty scan cell, respectively. If both observe and control conditions for a scan cell are satisfiable, then the scan cell is considered distinguishable from its adjacent scan cells in a scan chain.

FIG. 1B illustrates a merging process of D-cubes 1, 2, and 3 which are extracted based on control and observe conditions for scan chain including four scan cells A, B, C, and D and let all pairs of adjacent scan cells {A, B}, {B, C}, and {C, D} of the scan chain be indistinguishable. A D-cube may be a vector representing the values or value combinations of the scan cells A, B, C, and D of this scan chain. Accordingly, D-cubes include three symbols D, ~D, and X to represent constraints for satisfying control and observe conditions of all indistinguishable pairs of adjacent scan cells {A, B}, {B, C}, and {C, D} of the scan chain. Each pair of adjacent cells may have one or more alternative D-cubes which are generated based on satisfying either a control condition or an observe condition. In case of alternative D-cubes, only one D-cube per pair of adjacent scan cells is selected as representative. The goal is to merge as many representative D-cubes as possible. In the presented example, all representative D-cubes 1, 2, and 3 are compatible and the resultant D-cube <D,~D,~D,D> defines inversions in the scan path for the scan chain. In the presented example, all three pairs of adjacent scan cells of the scan chain become distinguishable by inserting two inverters in the scan path between scan cells {A,B} and {C,D}. Thus, type-3 design modifications (adding observe-points and control-points) are avoided by adding inverters in the scan paths (a type-2 design modification).

The design modifications, however, may undesirably increase the area and power consumption of circuit designs. Thus, it may be beneficial to use a process that helps avoid or reduce design modifications while maintaining or improving chain resolution.

Figure 1C:
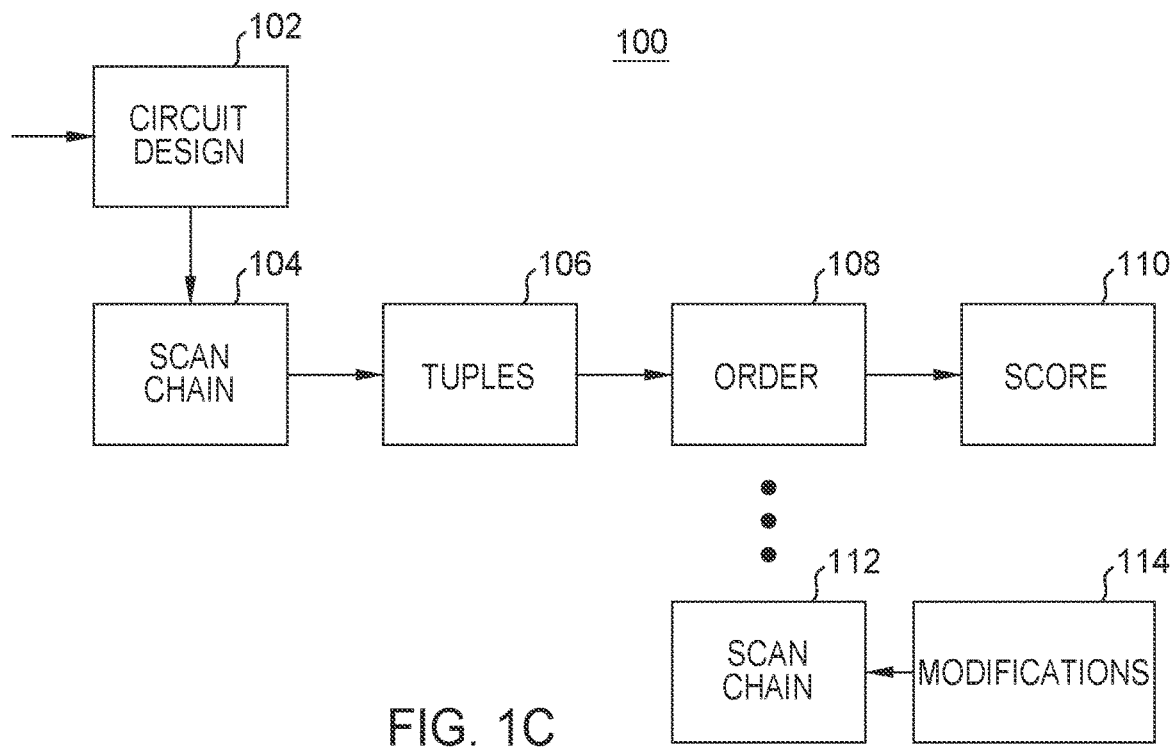
FIG. 1C illustrates an example operation for processing a circuit design.

FIG. 1C illustrates an example operation 100 for processing a circuit design 102. In certain embodiments, a computer system (e.g., the computer system 1400 shown in FIG. 14) performs the operation 100. By performing the operation 100, the computer system improves chain resolution.

The computer system receives the circuit design 102. The circuit design 102 may be provided by a circuit designer. The circuit design 102 may include circuit components, such as registers and combinational logic. The circuit design 102 also includes multiplexers that establish two different operational modes for the circuit design 102, a scan chain (or shift) mode and a normal (or capture) mode. During the scan chain (or shift) mode, the multiplexers are switched so that the registers are arranged into a scan chain 104 (e.g., a shift register). Each register may then be referred to as a scan cell of the scan chain 104. When the circuit design 102 is operating in the scan chain mode, the scan chain 104 is enabled and shifts logical values (or test stimulus) sequentially through the scan cells (or scan path). In the scan chain (or shift) mode, a signal SE (or scan enable) that controls the multiplexers in scan path is set to 1. In the scan chain (or shift) mode, each scan cell receives input from a scan cell that that immediately precedes this scan cell as well as provides output to a scan cell that that immediately follows the scan cell, respectively. Switching to the normal (or capture) mode disables the scan chain. During the normal (or capture) mode, the multiplexers are switched so that the registers store logical values (or test stimulus) and the combinational logic operates on the logical values (or test stimulus) in the registers. In the normal (or capture) mode, a signal SE (or scan enable) that controls the multiplexers in scan path is set to 0. During the normal (or capture) mode, all scan cells receive input from the combinational logic. Consequently, the captured values (or test response) of scan cells are shifted out using the scan chain (or shift) mode. In summary, a test pattern comprises the following operations: (i) shifting in a test stimulus in the scan chain (or shift) mode, (ii) capture test response in the normal (or capture) mode and (iii) shifting out test response in the scan chain (or shift) mode.

The computer system analyzes the scan chain 104 to determine one or more tuples 106 (also referred to as sensitizable paths). Each tuple 106 may indicate a scan cell that serves as the endpoint of a sensitizable path and a scan cell that serves as the start point for the sensitizable path. Each tuple 106 may also indicate scan cells that serve as necessary assignments for the sensitizable path. A tuple 106 may not indicate a scan cell that serves as the start point or a scan cell that serves as a necessary assignment. Scan cells that serve as a start point and/or a necessary assignment are also referred to as input scan cells of the tuple 106. Scan cells that serve as an end point are also referred to as an output scan cell of the tuple 106. For each tuple 106, the scan cell that serves as the start point and the scan cells that serve as necessary assignments are in the logic cone of the scan cell that serves as the endpoint. Additionally, both logical values (e.g., '0' and '1') can propagate from the scan cell that serves as the start point to the scan cell that serves as the endpoint if the scan cells that serve as necessary assignments are loaded with specific logical values. By identifying these tuples 106, the computer system can further determine an order 108 for the scan cells to improve chain resolution.

The computer system follows certain rules to determine the order 108 of the scan cells. For example, for a tuple 106, the computer system may determine an order 108 so that the scan cell that serves as the start point indicated by the tuple 106 and the scan cells that serve as necessary assignments indicated by the tuple 106 are placed outside the extended neighborhood of the scan cell that serves as the endpoint indicated by the tuple 106. The extended neighborhood includes the scan cells in the scan chain 104 that follow (or are downstream of) the scan cell that serves as the endpoint indicated by the tuple 106. The extended neighborhood also includes the scan cell that immediately precedes (or is adjacent to and upstream of) the scan cell that serves as the endpoint indicated by the tuple 106. Stated differently, the computer system may determine an order 108 for the scan cells so that the scan cell that serves as the start point indicated by the tuple 106 and the scan cells that serve as necessary assignments indicated by the tuple 106 are placed upstream and at least one scan cell away from the scan cell that serves as the endpoint indicated by the tuple 106. By ordering the scan cells in this manner, the computer system forms a scan chain that allows the computer system to exclude (or reject) the scan cell that serves as the endpoint indicated by the tuple 106 as a potential fault location. Stated differently, the scan cell that serves as the endpoint indicated by the tuple 106 becomes distinguishable from the scan cell immediately preceding the scan cell.

In certain embodiments, the computer system also determines an order 108 for the scan cells so that the scan cells that serve as necessary assignments indicated by the tuple 106 are placed upstream of the scan cell that serves as the start point indicated by the tuple 106. By ordering the scan cells in this manner, the computer system forms a scan chain that allows the computer system to exclude (or reject) the scan cell that serves as the start point indicated by the tuple 106 as a potential fault location. Stated differently, the scan cell that serves as the start point indicated by the tuple 106 becomes distinguishable from the scan cell immediately following the scan cell. In particular embodiments, ordering the scan cells involves forming multiple scan chains and placing some of the scan cells into different scan chains.

The computer system calculates a score 110 for the order 108. The score 110 may indicate the number of pairs of adjacent scan cells that are distinguishable from each other as a result of the order 108. Generally, the greater the score, the higher the chain resolution for the scan chain formed with the order 108. The computer system may determine any number of tuples 106 and any number of orders 108 for the scan cells. The computer system also calculates a score 110 for each order 108. The computer system may select the order 108 that has the greatest score 110 and form a scan chain 112 that follows that order 108. Thus, the scan chain 112 is a reordered version of the scan chain 104 with the greatest score 110. As a result, the scan chain 112 may have a higher chain resolution than the scan chain 104.

Even though the scan chain 112 may have a different ordering of scan cells than the scan chain 104, the function of the circuit design 102 in the normal mode does not change. Stated differently, the ordering of the scan cells in the scan chain 112 is different from the ordering of the scan cells in the scan chain 104 in the scan chain mode. Note that the ordering of the scan cells has no impact on the normal mode, and the scan chain 104 and the scan chain 112 are considered functionally the same circuit design. Also, the ordering of the scan cells and design modification have no impact on a functional mode (or normal mode) of the circuit design.

In some embodiments, the computer system makes further modifications 114 to the scan chain 112. The scan chain 112 may not have a 100% chain resolution. The computer system may make modifications 114 to the scan chain 112 that further improve chain resolution. For example, the computer system may add inverters and/or multiplexers into the scan path of the scan chain 112, which may cause certain adjacent pair of scan cells in the scan chain 112 to become distinguishable. In this manner, the computer system further improves chain resolution in the scan chain 112.

Figure 2:
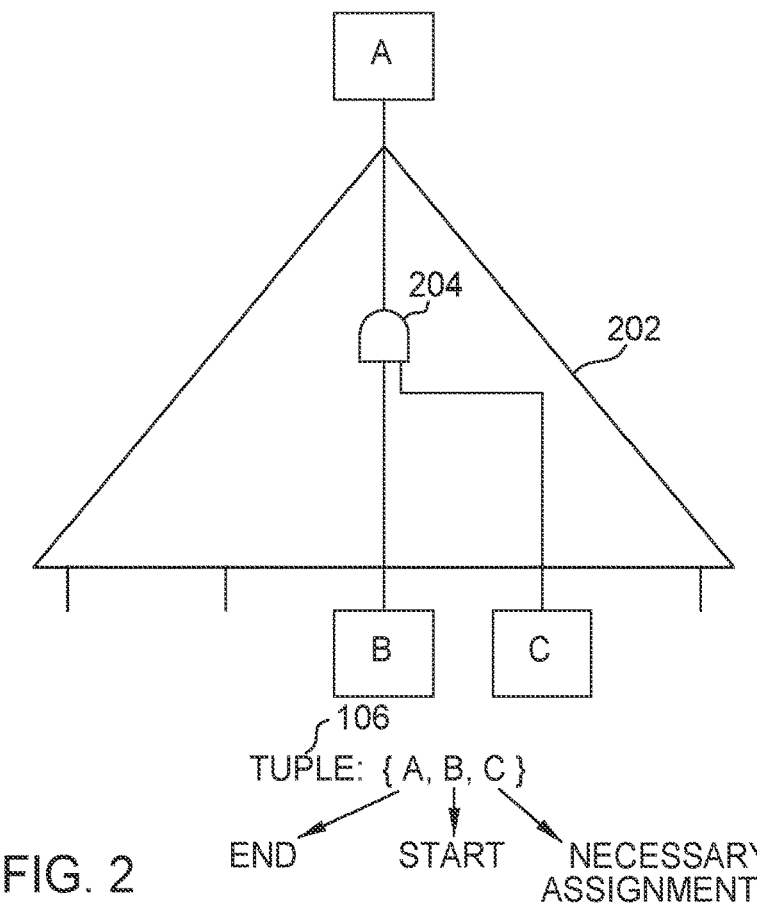
FIG. 2 illustrates an example of a tuple.

FIG. 2 illustrates an example of a tuple 106. Generally, the computer system uses the tuple 106 to indicate a sensitizable path in the scan chain. As seen in FIG. 2, the scan cells B and C are in the logic cone 202 of the scan cell A, which means that the values at the scan cells B and C affect the value at the scan cell A. For example, the scan cells B and C may provide input to an AND gate 204, and the scan cell A may receive the output of the AND gate 204. The tuple 106 {A, B, C} indicates that the scan cells A, B, and C form a sensitizable path in the scan chain 104. The scan cell A serves as the endpoint of the path. The scan cells B and C may serve as the start point of the path or as necessary assignments for the path. In the example of FIG. 2, the scan cell A serves as the end point of the path, and the scan cell B serves as the start point of the path. The scan cell C serves as the necessary assignment for the path. Specifically, as a result of the scan cell A being the output of the AND gate 204, when the scan cell C is set to the logical value 1, the logical value at the scan cell B propagates to the scan cell A.

The path in the example of FIG. 2 is represented by the tuple 106 {A, B, C}. The first value of the tuple 106 indicates the endpoint of the path (e.g., scan cell A). The second value of the tuple 106 indicates the start point of the path (e.g., scan cell B). Subsequent values in the tuple 106 indicate necessary assignments in the path (e.g., scan cell C).

Figure 3:
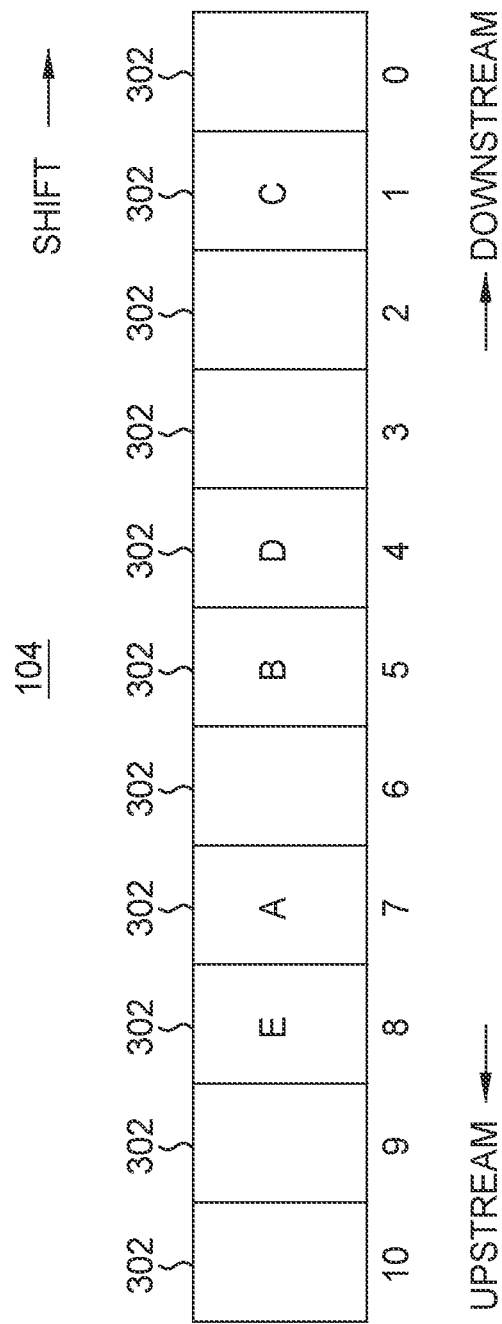
FIG. 3 illustrates an example scan chain.

FIG. 3 illustrates an example scan chain 104. As seen in FIG. 3, the scan chain 104 is formed by arranging scan cells 302 sequentially into a shift register. The scan cells 302 are indexed from 0 to 10. The scan cells 302 shift values from the greater index towards lower indices (from left to right in the example of FIG. 3). That direction is indicated as downstream. The opposite direction is indicated as upstream. As a result, the scan cell E is upstream of the scan cells A, B, D, and C, and the scan cell A is downstream of the scan cell E. The scan cell C is downstream of the scan cells E, A, B, and D. Additionally, the scan cells E and A are adjacent to one another, and the scan cells B and D are adjacent to one another. Thus, the scan cell E immediately precedes the scan cell A, because the scan cell E is adjacent to and upstream of the scan cell A. The scan cell A immediately follows the scan cell E, because the scan cell A is adjacent to and downstream of the scan cell E.

Figure 4:
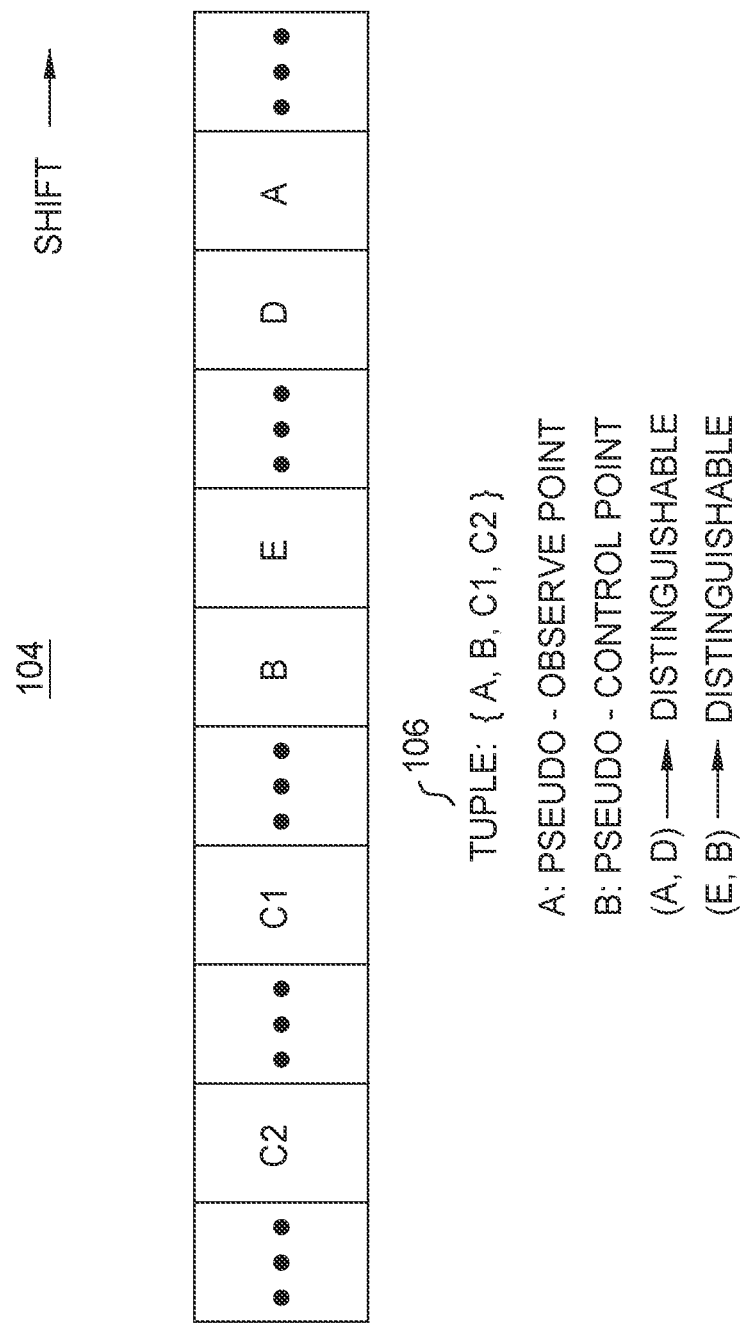
FIG. 4 illustrates an example scan chain.

FIG. 4 illustrates an example scan chain 104. As seen in FIG. 4, the scan chain 104 shifts from the left to the right. The computer system may identify a sensitizable path in the scan chain 104 in which the scan cell A serves as the endpoint, the scan cell B serves as the start point, and the scan cells C1 and C2 serve as necessary assignments. This sensitizable path is indicated by the tuple 106 {A, B, C1, C2}. Because the scan cells B, C1, and C2 are all outside the extended neighborhood of scan cell A (e.g., the scan cells B, C1, and C2 are upstream of scan cell A by more than one scan cell), scan cell A is considered a pseudo-observe point. Additionally, because scan cell A is a pseudo-observe point and because the scan cells C1 and C2 are upstream of scan cell B, scan cell B is considered a pseudo-control point. Because the scan cell A is a pseudo-observe point, scan cell D (which is adjacent to and upstream of scan cell A) is distinguishable from scan cell A. Because the scan cell B is a pseudo-control point, scan cell E (which is adjacent to and downstream of scan cell B) is distinguishable from scan cell B. As a result, the computer system may exclude (or reject) the scan cells A and B as potential fault locations.

Figure 5:
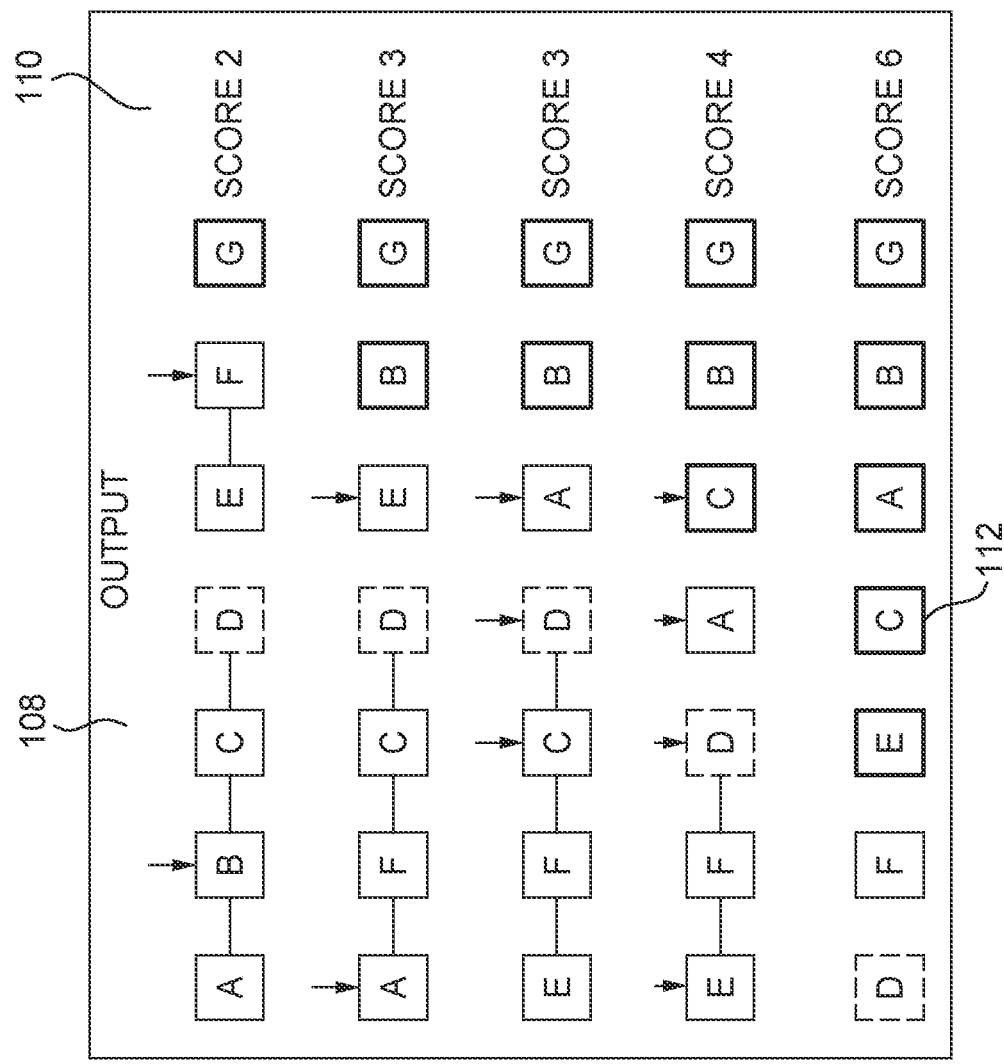
FIG. 5 illustrates an example of forming a scan chain.

FIG. 5 illustrates an example of forming a scan chain 112. As seen in FIG. 5, the circuit design includes the scan cells A, B, C, D, E, F, and G. The computer system has identified the sensitizable paths indicated by the tuples 106 {A, D, E, F}, {B, A, C, E}, {B, D}, {C, D}, {E, D}, {F, G}, and {G, D, A}.

The computer system iteratively determines orders 108 for the scan cells for the tuples 106 and calculates a score 110 for each order 108. The scan cells begin with the order 108 A, B, C, D, E, F, G. As seen in FIG. 5, in this ordering, the scan cell D is a pseudo-control point and the scan cell G is a pseudo-observe point. Specifically, for the tuple 106 {G, D, A}, the scan cells D and A are placed upstream of the scan cell G by more than one scan cell. Thus, the scan cell G is a pseudo-observe point. Additionally, the scan cell G is a pseudo-observe point and the scan cell A is placed upstream of the scan cell D. Thus, the scan cell D is a pseudo-control point. As a result, the computer system determines there are two distinguishable pairs of scan cells (D, E) and (F, G), resulting in a score 110 of two.

In a second iteration, the computer system swaps the positions of scan cell B and scan cell F, resulting in the order 108 A, F, C, D, E, B, G. As seen in FIG. 5, in this order 108, the scan cell D is a pseudo-control point and the scan cells B and G are pseudo-observe points. Specifically, the scan cell D remains a pseudo-control point and the scan cell G remains a pseudo-observe point for the reasons in the previous iteration. For the tuple 106 {B, D}, the scan cell D is placed upstream of the scan cell B by more than one scan cell. Thus, the scan cell B is a pseudo-observe point. Additionally, the scan cell B is a pseudo-observe point and there are no necessary assignments. Thus, the scan cell D is a pseudo-control point. As a result, the computer system determines there are three distinguishable pairs of scan cells (D, E), (E, B), and (B, G), resulting in a score 110 of three.

In a third iteration, the computer system swaps the positions of the scan cell A and the scan cell E, resulting in the order 108 E, F, C, D, A, B, G. As seen in FIG. 5, in this order 108, the scan cell D is a pseudo-control point and the scan cells B and G are pseudo-observe points. The scan cell D remains a pseudo-control point and the scan cells B and G remain pseudo-observe points for the reasons in the previous iterations. No other scan cells become a pseudo-observe point or pseudo-control point as a result of the adjustment. Notably, however, the scan cell A is no longer upstream of the scan cell D, which means for the tuple 106 {G, D, A}, the scan cell D is no longer a pseudo-control point. The scan cell D remains a pseudo-control point for the tuple 106 {B, D}. As a result, the computer system determines there are three distinguishable pairs of scan cells (D, A), (A, B), and (B, G), resulting in a score 110 of three.

In a fourth iteration, the computer system changes the positions of the scan cells C, D, and A, resulting in the order 108 E, F, D, A, C, B, G. As seen in FIG. 5, in this order 108, the scan cell D remains a pseudo-control point and the scan cells C, B, and G are pseudo-observe points. The scan cell D remains a pseudo-control point and the scan cells B and G remain pseudo-observe points for the reasons in the previous iterations. For the tuple 106 {C, D}, the scan cell D is placed at least one scan cell upstream of the scan cell C. Thus, the scan cell C is a pseudo-observe point. Additionally, the scan cell C is a pseudo-observe point and there are no necessary assignments. Thus, the scan cell D is a pseudo-control point. As a result, the computer system determines there are four distinguishable pairs of scan cells (D, A), (A, C), (C, B), and (B, G), resulting in a score 110 of four.

In a fifth iteration, the computer system changes the positions of the scan cells E, D, A, and C, resulting in the order 108 D, F, E, C, A, B, G. As seen in FIG. 5, in this order 108, the scan cell D remains a pseudo-control point and the scan cells C, B, and G remain pseudo-observe points for the reasons in the previous iterations. For the tuple 106 {A, D, E, F}, the scan cells D, E, and F are placed upstream of the scan cell A by more than one scan cell. Thus, the scan cell A is a pseudo-observe point. For the tuple 106 {E, D}, the scan cell D is placed upstream of the scan cell E by more than one scan cell. Thus, the scan cell E is a pseudo-observe point. Additionally, there are no necessary assignments, so the scan cell D is a pseudo-control point. As a result, the computer system determines there are six distinguishable pairs of scan cells (D, F), (F, E), (E, C), (C, A), (A, B), and (B, G), resulting in a score 110 of six.

The computer system may evaluate the scores 110 for the different orders 108 and selects an order 108 based on the scores 110. For example, the computer system may select the order 108 with the highest score 110, which is the order 108 D, F, E, C, A, B, G. The computer system may then adjust the connections in the circuit design 102 to form a scan chain 112 with the scan cells D, F, E, C, A, B, and G, in that order 108. For example, the computer system may adjust the connections to the multiplexers to order the scan cells in this order 108. This adjustment may not cause the positions of the scan cells in the normal mode of operation to change.

In some embodiments, the computer system incorporates the score into a cost function that considers other factors (e.g., wirelength, power consumption, etc.). The computer system may then select the adjustment that produces the best output from the cost function. For example, the cost function may be CF(SCS)*(100+N*CF(DFD))/100, where CF(SCS) is the cost function that considers factors other than chain resolution (e.g., wirelength, power consumption, etc.). CF (DFD) is a ratio of (i) the difference between the number of pairs of adjacent scan cells in the scan chain and the score 110 of an adjustment and (ii) the number of pairs of adjacent scan cells in the scan chain. N is a user defined limit for a desired overhead expressed as a percentage. CF (DFD) being zero indicates that all adjacent pairs of scan cells in the scan chain are distinguishable. CF (DFD) being one indicates that all adjacent pairs of scan cells in the scan chain are indistinguishable, and a penalty of N percent is added to CF(SCS). The computer system may evaluate the cost function for each adjustment to the scan chain and select the adjustment that produces the best cost function output (e.g., the lowest cost function output).

FIG. 6 illustrates an example scan chain 104. As seen in FIG. 6, the scan chain 104 includes the scan cells A, B, C1, and C2, which form a sensitizable path indicated by the tuple 106 {A, B, C1, C2}. The scan cell A serves as the endpoint. The scan cell B serves as the start point. The scan cells C1 and C2 serve as the necessary assignments. The scan cell B is placed upstream of the scan cell A. The scan cells C1 and C2 are placed upstream of the scan cell B. In this situation, the scan cell A is considered a conditional observe point. As a result, the scan cell A and a scan cell adjacent to the scan cell A (e.g., scan cell B) may become distinguishable if the computer system adds an inverter in the scan chain 104 between the scan cells A and B. Thus, the computer system may add the inverter between the scan cells A and B, which may improve the chain resolution of the scan chain 104.

Thus, the tuples 106 for a circuit design 102 may suggest or indicate a set of rules (which may also be referred to as "stitching rules") or constraints that may be followed when setting or determining the order 108 of the scan cells. For example, the rules may indicate which scan cells should be placed upstream of other scan cells by more than one scan cell (e.g., outside the extended neighborhood of the said other scan cells). By setting the order of the scan cells according to these rules, the computer system may form a scan chain 112 with an increased chain resolution. Specifically, following the rules may increase the number of pseudo-observe points and/or pseudo-control points, which increases chain resolution.

Figure 7:
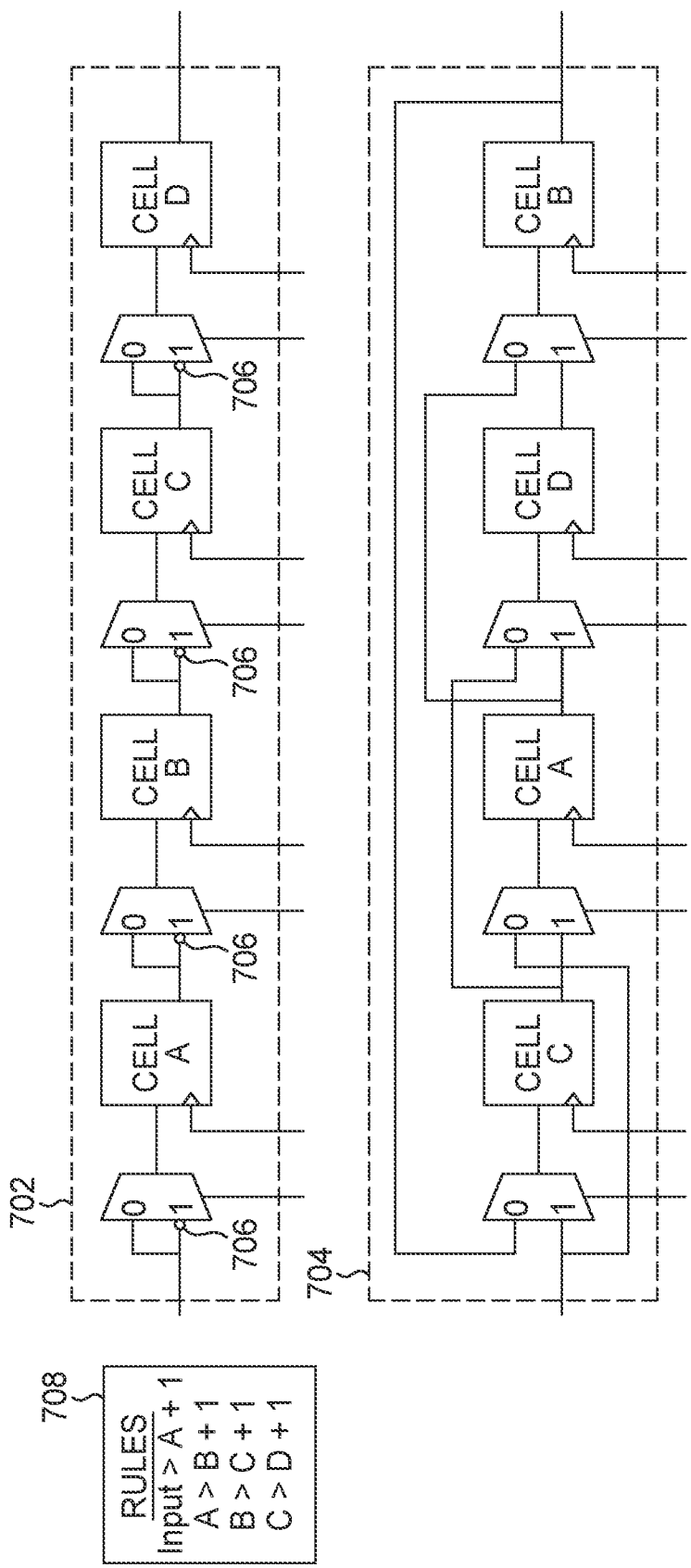
FIG. 7 illustrates an example of forming a scan chain.

FIG. 7 illustrates an example of determining an order for scan cells in a scan chain 702 to form a scan chain 704. As seen in FIG. 7, the scan chain 702 includes the scan cells A, B, C, and D, in that order. During the normal mode of operation (0 bit selected in the multiplexers), the scan cells are ordered A, B, C, D. During the scan chain mode of operation (1 bit selected in the multiplexers), the scan cells are ordered A, B, C, D. Accordingly, scan cells A, B, C, and D are conditional observe points because each one of the scan cells is logically coupled to the adjacent upstream scan cell only. To make the scan cells distinguishable from one another, inverters 706 are added to the scan path between the scan cells.

According to the tuples 106 for the scan chain 702, the following rules 708 should be followed when determining the order of the scan cells. First, the input to the scan chain 702 should be placed upstream of scan cell A by more than one scan cell (Input>A+1). Second, scan cell A should be placed upstream of scan cell B by more than one scan cell (A>B+1). Third, scan cell B should be placed upstream of scan cell C by more than one scan cell (B>C+1). Fourth, scan cell C should be placed upstream of scan cell D by more than one scan cell (C>D+1).

The computer system sets the ordering of the scan cells according to the rules 708 to form the scan chain 704. As seen in FIG. 7, the scan chain 704 still includes the scan cells A, B, C, and D. During the normal mode of operation (0 bit selected in the multiplexers), the scan cells are still ordered A, B, C, D. During the scan chain mode of operation (1 bit selected in the multiplexers), the scan cells are ordered C, A, D, B. According to the rule Input>A+1, scan cell A has been placed such that the input to the scan chain 704 is upstream of scan cell A by more than one scan cell. Scan cell A is now a pseudo-observe point because the Input to the scan chain 704 is placed upstream of scan cell A by more than one scan cell.

According to the rule A>B+1, scan cell B has been placed such that scan cell A is upstream of scan cell B by more than one scan cell. Scan cell B is now a pseudo-observe point, because scan cell A is placed upstream of scan cell B by more than one scan cell. Additionally, scan cell A is a pseudo-control point, because scan cell B is a pseudo-observe point and there are no necessary assignments.

According to the rule C>D+1, scan cell C has been placed upstream of scan cell D by more than one scan cell. Scan cell D is a pseudo-observe point, because scan cell C is placed upstream of the scan cell D by more than one scan cell. Additionally, scan cell C is a pseudo-control point, because scan cell D is a pseudo-observe point and there are no necessary assignments.

In summary, scan cells A, B, and D are pseudo observe points and scan cells C and A are pseudo-control points. Accordingly, each pair of adjacent scan cells {C,A}, {A,D}, and {D,B} in scan chain 704 has either a downstream adjacent scan cell that is a pseudo-observe point or an upstream adjacent scan cell that is a pseudo-control point, respectively. As a result, all pairs of adjacent scan cells in the scan chain 704 are distinguishable while reducing all inverters 706 in the scan path.

Figure 8:
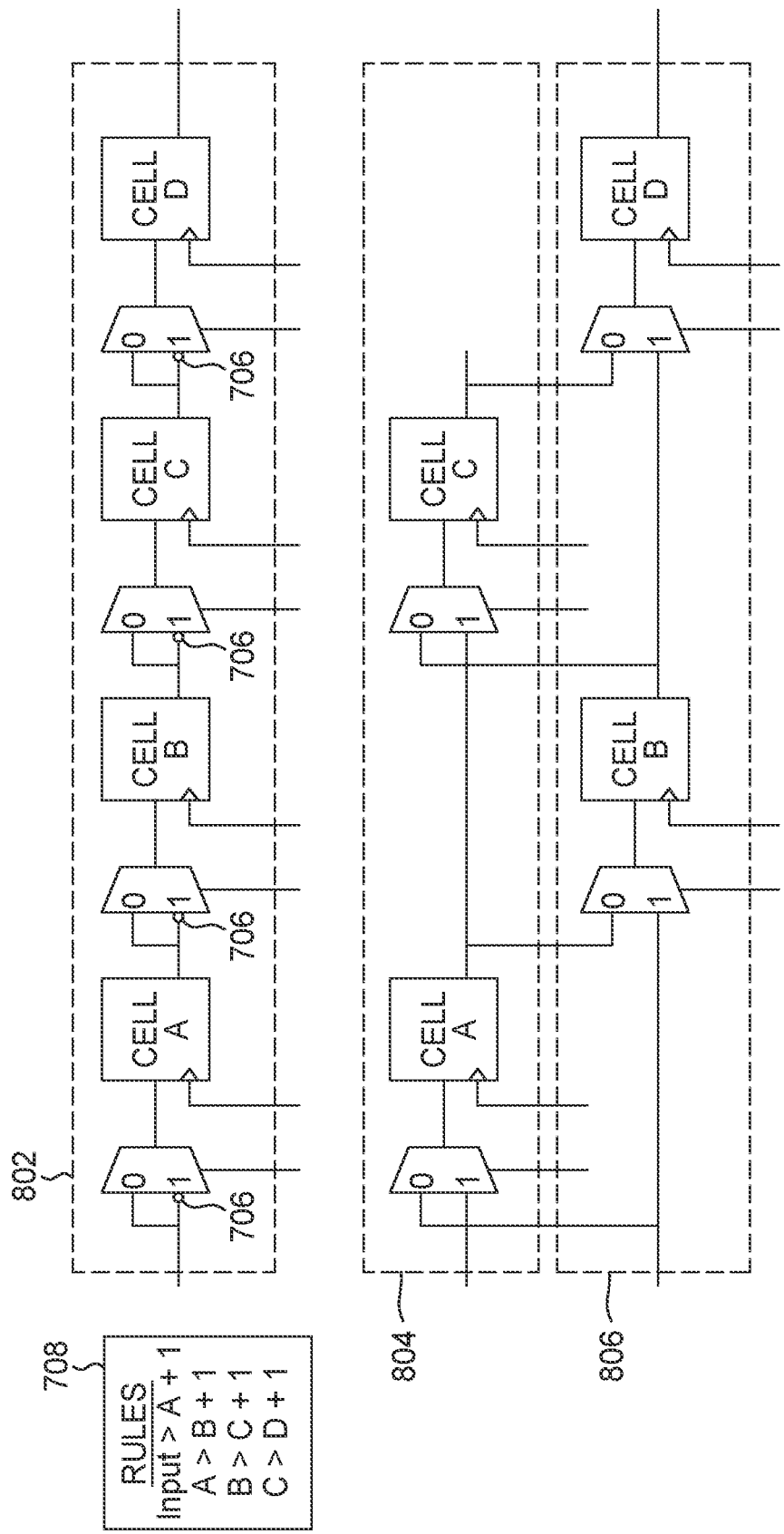
FIG. 8 illustrates an example of forming a scan chain.

The order of the scan cells may cause certain scan cells to be placed in different scan chains. FIG. 8 illustrates an example of determining an order for scan cells in a scan chain 802 to form the scan chains 804 and 806. The scan chain 802 is the same as the scan chain 702, and the computer system identifies the same rules 708 to be followed when adjusting the scan cells.

The computer system determines the order for the scan cells to form the scan chains 804 and 806. Specifically, the computer system sets the order of the scan cells, which places scan cells into different scan chains. As seen in FIG. 8, the scan chain 804 includes the scan cells A and C, and the scan chain 806 includes the scan cells B and D. For the normal mode of operation (0 bit selected in the multiplexers), the scan cells are still ordered A, B, C, D. During the scan chain mode of operation (1 bit selected in the multiplexers), the scan cells are ordered A, C in the scan chain 804 and B, D in the scan chain 806. Scan cell A is in a different scan chain than the input to the scan cell 806, scan cell B is in a different scan chain 806 than scan cell A, scan cell C is in a different scan chain 804 than scan cell B, and scan cell D is in a different scan chain 806 than scan cell C. As a result, the scan cells are distinguishable from each other, and no inverters 706 need to be added to the scan chains 804 and 806.

Figure 9:
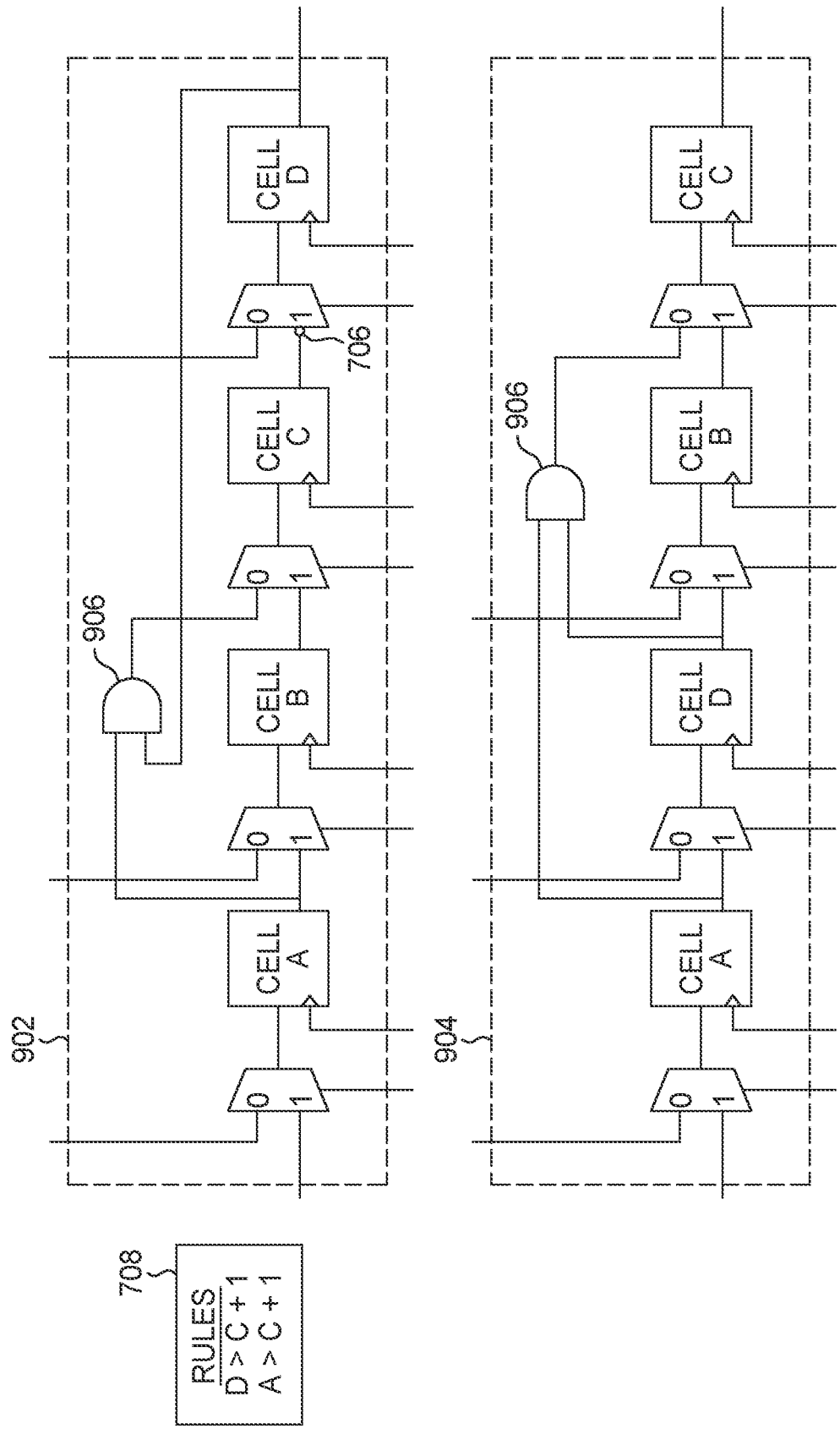
FIG. 9 illustrates an example of forming a scan chain.

FIG. 9 illustrates an example of determining an order for scan cells in a scan chain 902 to form a scan chain 904. As seen in FIG. 9, the scan chain 902 includes the scan cells A, B, C, and D and the AND gate 906. During the normal mode of operation (0 bit selected in the multiplexers), the scan cells are ordered (A, B, D), C (e.g., the scan cells A, B, and D each receive the input to the scan chain 902, while the scan chain C receives the logical AND of the outputs of the scan cells A and D). During the scan chain mode of operation (1 bit selected in the multiplexers), the scan cells are ordered A, B, C, D. The computer system adds an inverter 706 in the scan path between the scan cells C and D so that the scan cells C and B are distinguishable. By inserting an inverter 706, scan cell C is a pseudo-observe point and may capture faulty-free value if there is a fault in scan cell B. As a result, that excludes (or rejects). As a result, scan cell C is excluded (or rejected) as a potential fault location.

According to the tuples 106 for the scan chain 902, the following rules 708 should be followed when determining the order of the scan cells. First, scan cell D should be placed upstream of scan cell C by more than one scan cell (D>C+1). Second, scan cell A should be placed upstream of scan cell C by more than one scan cell (A>C+1).

The computer system sets the order of the scan cells according to the rules 708 to form the scan chain 904. As seen in FIG. 9, the scan chain 904 still includes the scan cells A, B, C, and D. During the normal mode of operation (0 bit selected in the multiplexers), the scan cells are still ordered (A, B, D), C. During the scan chain mode of operation (1 bit selected in the multiplexers), the scan cells are ordered A, D, B, C. According to the rule D>C+1, scan cell D is placed upstream of scan cell C by more than one scan cell. According to the rule A>C+1, scan cell A is placed upstream of scan cell C by more than one scan cell. Thus, the scan cells C and B are distinguishable without having to add any inverters 706 to the scan chain 904.

Figure 10:
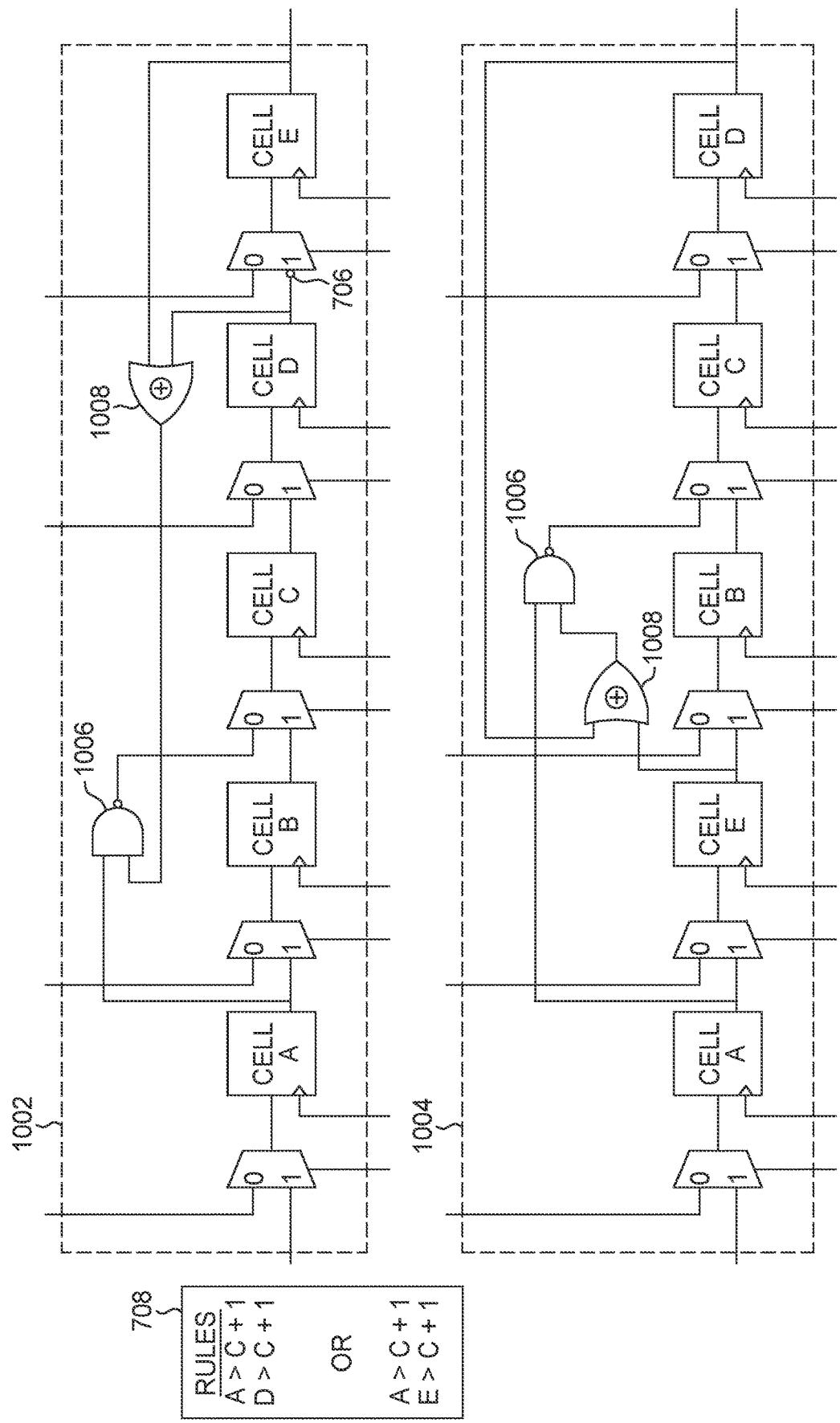
FIG. 10 illustrates an example of forming a scan chain.

FIG. 10 illustrates an example of determining an order for scan cells in a scan chain 1002 to form a scan chain 1004. As seen in FIG. 10, the scan chain 1002 includes the scan cells A, B, C, D, and E, the NAND gate 1006, and the OR gate 1008. During the normal mode of operation (0 bit selected in the multiplexers), the scan cells are ordered (A, B, D, E), C (e.g., the scan cells A, B, D, and E each receive the input to the scan chain 1002, while the scan chain C receives the logical NAND of the outputs of the scan cell A and the OR gate 1008, which is the logical OR of the outputs of the scan cells D and E). During the scan chain mode of operation (1 bit selected in the multiplexers), the scan cells are ordered A, B, C, D, E. The computer system adds an inverter 706 in the scan path between the scan cells D and E to make the scan cells D and E distinguishable.

According to the tuples 106 for the scan chain 1002, the following rules 708 should be followed when adjusting the order of the scan cells. Either (i) both scan cells A and D should be placed upstream of scan cell C by more than one scan cell (A>C+1, D>C+1) or (ii) both scan cells A and E should be placed upstream of scan cell C by more than one scan cell (A>C+1, E>C+1).

The computer system sets the order of the scan cells according to the rules 708 to form the scan chain 1004. As seen in FIG. 10, the scan chain 1004 still includes the scan cells A, B, C, D, and E. During the normal mode of operation (0 bit selected in the multiplexers), the scan cells are still ordered (A, B, D, E), C. During the scan chain mode of operation (1 bit selected in the multiplexers), the scan cells are ordered A, E, B, C, D. According to the rule A>C+1, E>C+1, both scan cells A and E are placed upstream of scan cell C by more than scan cell. Scan cell D remains downstream of scan cell C. Thus, the scan cells are distinguishable without having to add any inverters 706 to the scan chain 1004.

Figure 11:
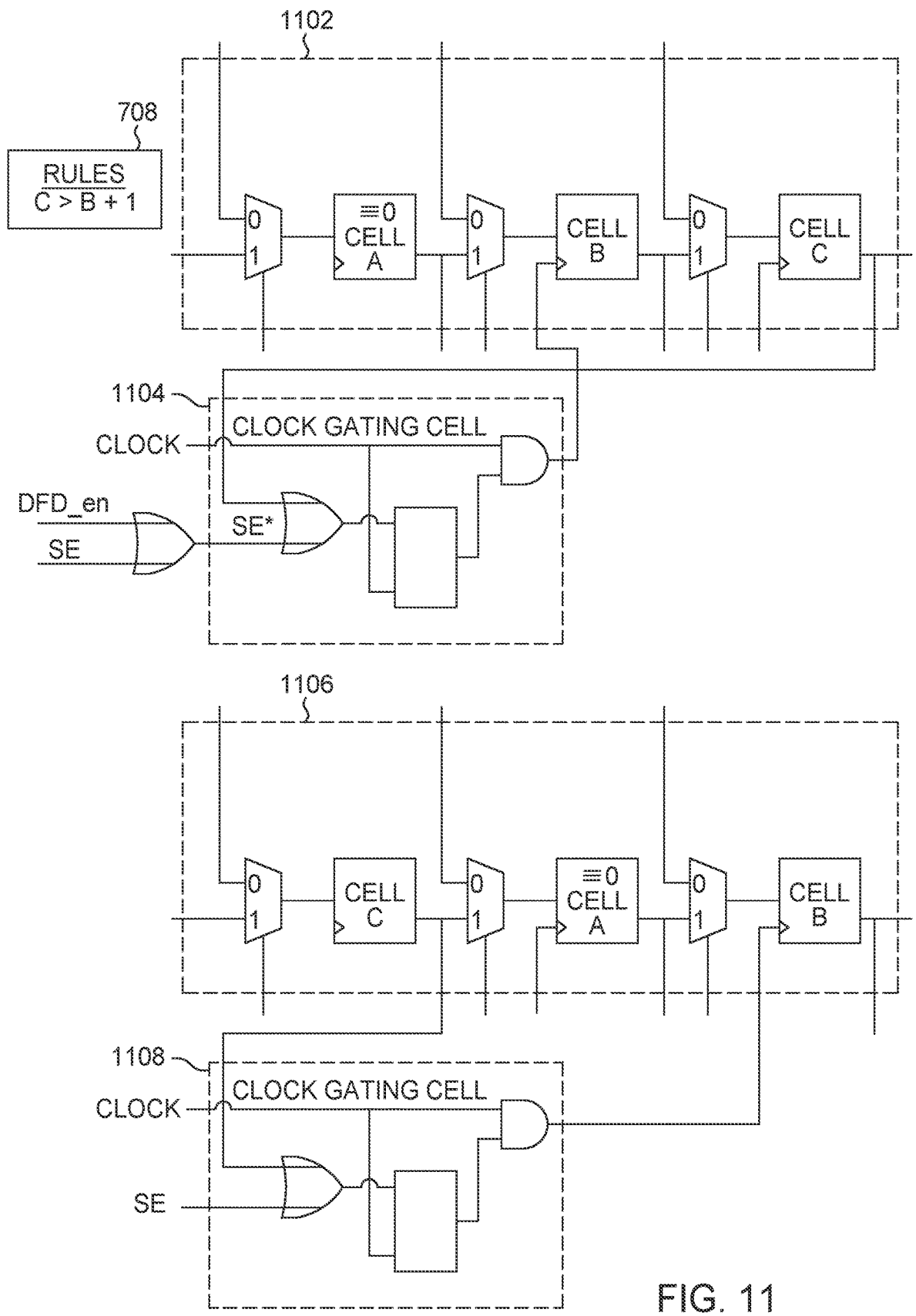
FIG. 11 illustrates an example of forming a scan chain.

FIG. 11 illustrates an example of determining an order for scan cells in a scan chain 1102 to form a scan chain 1106. As seen in FIG. 11, clock pulses of the scan chain 1102 are controlled by the clock gating cell 1104, and the scan chain 1106 is controlled by the clock gating cell 1108. During the scan chain mode of operation (1 bit selected in the multiplexers or SE=1), the clock gating cell is disabled. As a result, all scan cells receive clock pulses, and the scan cells are ordered A, B, C. During the normal mode of operation (0 bit selected in the multiplexers or SE=0), the clock gating cell 1104 is enabled for the scan chain 1102. As a result, the scan cells are ordered (A, B, C) (e.g., scan cells A, B, and C each receive the input to the scan chain 1102) and scan cell B receives a clock pulse only when the value of scan cell C is set to 1. Notably, the clock gating cell 1104 controls the operation of scan cell B, but the output of scan cell C, which is downstream from scan cell B, controls the operation of the clock gating cell 1104. As a result, scan cell B may fail to receive a clock pulse if there is a faulty value in scan cell C. Clock gating cell 1104 has an extra signal DFD_en. Setting DFD_en to 1 disables clock gating cell 1104 and ensures that scan cell B receives a clock pulse even if there is a fault in the scan chain during the normal (or capture) mode. Stated differently, by selectively disabling the clock gating cell 1104, the computer system ensures that all scan cells that are coupled to (or controlled by) the clock gating cell 1104 may receive clock pulses in the presence of faults during the normal (or capture) mode.

According to the tuples 106 for the scan chain 1102, the following rule 708 should be followed when determining or selecting the order of the scan cells. Scan cell C should be placed upstream of scan cell B by more than one scan cell (C>B+1).

The computer system sets the order of the scan cells according to the rule 708 to form the scan chain 1106. As seen in FIG. 11, the scan chain 1106 still includes the scan cells A, B, and C. The clock gating cell 1108 is still controlled by the output of scan cell C, and the clock gating cell 1108 controls scan cell B. During the normal mode of operation (0 bit selected in the multiplexers or SE=0), the scan cells are still ordered (A, B, C). During the scan chain mode of operation (1 bit selected in the multiplexers), the scan cells are ordered C, A, B. According to the rule C>B+1, scan cell C is placed upstream of scan cell B by more than one scan cell. As a result, the clock gating cell 1108 does not need to be disabled during the normal mode when scan cells receive inputs from the combinational logic of the circuit design.

Figure 12:
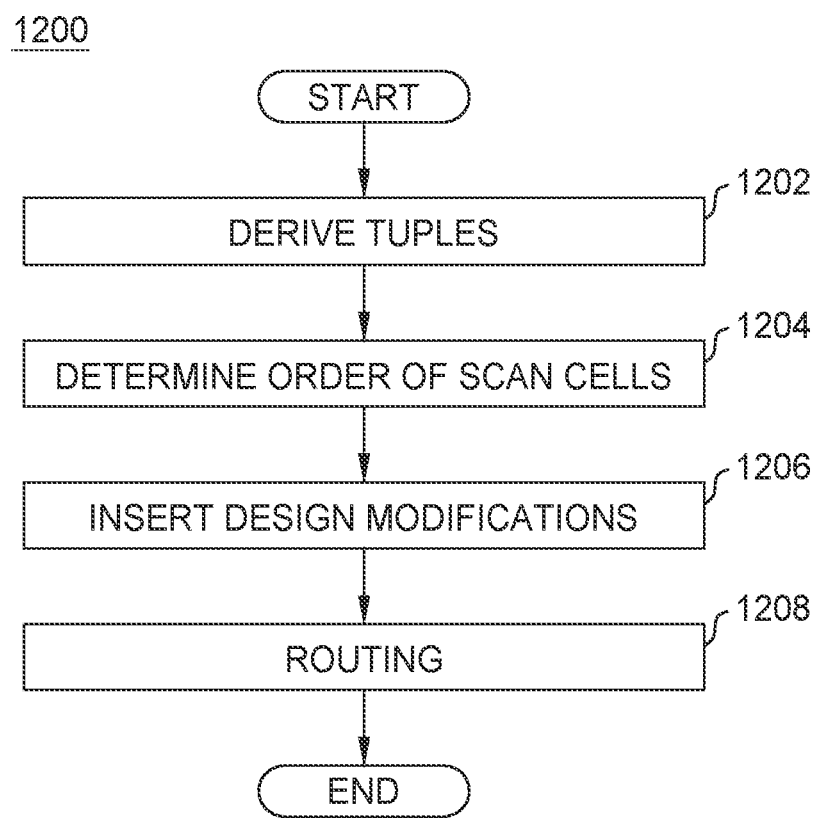
FIG. 12 is a flowchart of an example method of processing a circuit design.

FIG. 12 is a flowchart of an example method 1200 of adjusting a circuit design 102. In particular embodiments, a computer system (e.g., the computer system 1400 shown in FIG. 14) performs the method 1200. By performing the method 1200, the computer system increases the chain resolution of the circuit design 102.

At 1202, the computer system derives tuples 106 indicating sensitizable paths in a scan chain 104. Each tuple 106 may indicate a scan cell that serves as an endpoint, a scan cell that serves as a start point, and scan cells that serve as necessary assignments. For each tuple 106, a value at the scan cell that serves as the start point may propagate to the scan cell that serves as the endpoint when the scan cells that serve as necessary assignments are set to specific load values.

At 1204, the computer system determines the order 108 of the scan cells. The computer system may analyze each tuple 106 and determine the order 108 of the scan cells so that the scan cells that serve as the start point or the necessary assignments are placed outside an extended neighborhood of the scan cell that serves as the endpoint. The extended neighborhood includes (i) the scan cells that are downstream from the scan cell that serves as the endpoint and (ii) the scan cell that is adjacent to and upstream from the scan cell that serves as the endpoint. The computer system may perform 1206 iteratively for different tuples 106 to determine or select different orders 108 for the scan cells. The computer system may then determine or select the order 108 that provides the best chain resolution. For example, the computer system may score each order 108 based on the number of distinguishable pairs of scan cells in that order 108. The computer system may then select the order 108 with the highest score. The computer system then forms a scan chain with the scan cells arranged in the determined or selected order 108. In this manner, the computer system improves chain resolution.

At 1206, the computer system inserts design modifications into the circuit design 102. The determined or selected order 108 may not make every adjacent pair of scan cells distinguishable. To further improve chain resolution, the computer system may insert inverters 706 or multiplexers into the scan path so that some of the indistinguishable pairs of scan cells become distinguishable. In this manner, the computer system further improves the chain resolution of the scan chain. By determining and setting the order 108 of the scan cells prior to inserting the inverters 706 or multiplexers, the computer system may add fewer inverters 706 or multiplexers to the scan chain to achieve the same chain resolution as existing processes, which results in a smaller area and lower power consumption relative to existing processes. At 1208, the computer system determines a routing for the circuit components. For example, the computer system may route the connections between the circuit components in the circuit design. The routing may be consistent with the determined order 108 of scan cells in the scan chain.

In summary, the circuit design process helps in locating faulty scan cells in a scan chain. The process involves determining and setting an order for the scan cells so that scan cells that provide inputs (or input cells) to another scan cell are placed outside an extended neighborhood of the said another scan cell. The extended neighborhood of the said another scan cell includes scan cells that are further down the scan chain from the said another scan cell. The extended neighborhood also includes the scan cell that immediately precedes the said another scan cell in the scan chain. By placing the input scan cells outside of the extended neighborhood of the said another scan cell, it becomes possible to exclude (or reject) the said another scan cell as a potential fault location. By repeating this process for multiple scan cells in the scan chain, it is possible to locate faults in more scan cells in the scan chain, improving chain resolution.

Figure 13:
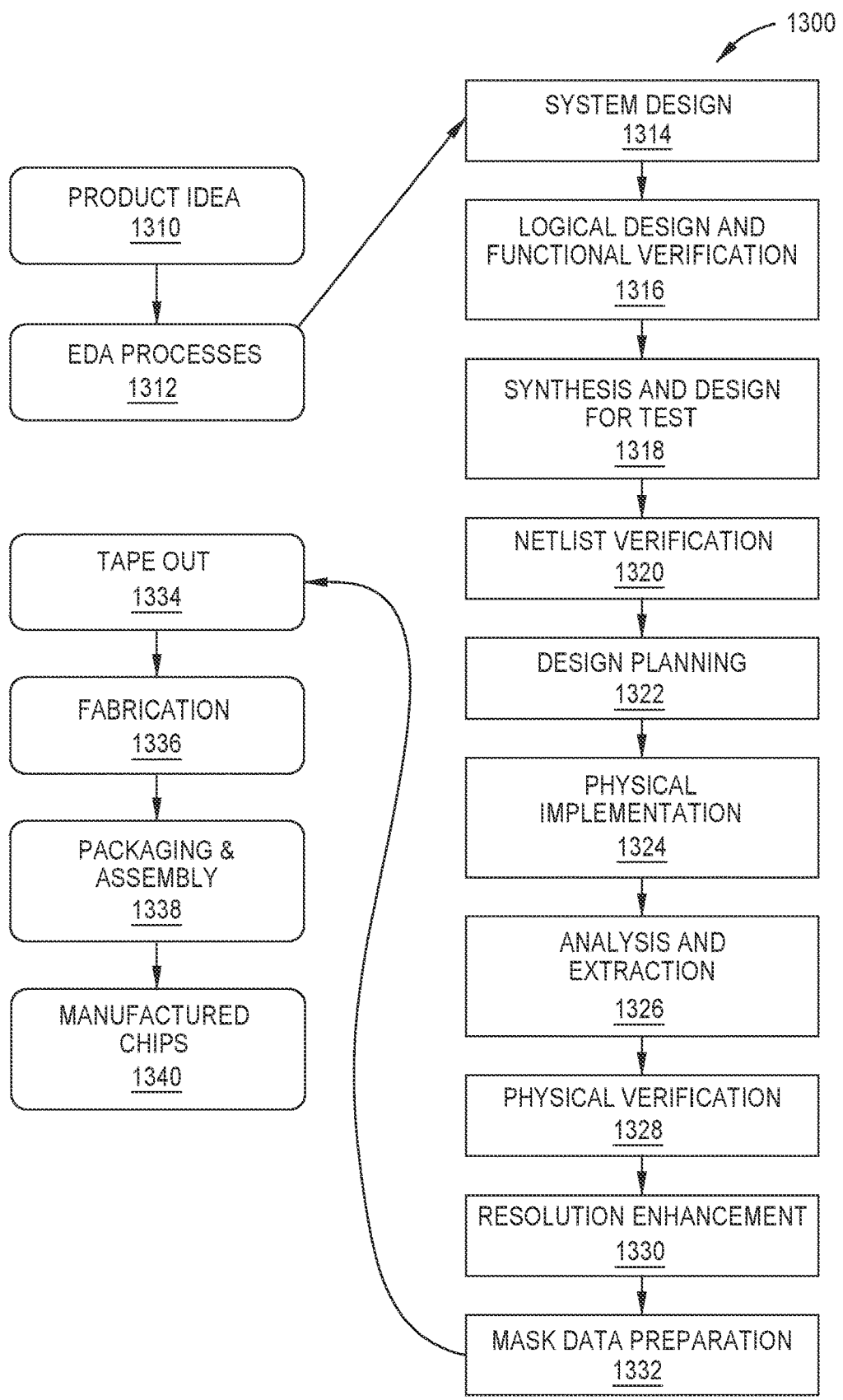
FIG. 13 depicts a flowchart of various processes used during the design and manufacture of an integrated circuit in accordance with some embodiments of the present disclosure.

FIG. 13 illustrates an example set of processes 1300 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1310 with information supplied by a designer, information which is transformed to create an article of manufacture that uses a set of EDA processes 1312. When the design is finalized, the design is taped-out 1334, which is when artwork (e.g., geometric patterns) for the integrated circuit is sent to a fabrication facility to manufacture the mask set, which is then used to manufacture the integrated circuit. After tape-out, a semiconductor die is fabricated 1336 and packaging and assembly processes 1338 are performed to produce the finished integrated circuit 1340.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or Open Vera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 13. The processes described by be enabled by EDA products (or EDA systems).

During system design 1314, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1320, the netlist is checked for compliance with timing constraints and for correspondence with the HDL code. During design planning 1322, an overall floor plan for the integrated circuit is constructed and analyzed for timing and top-level routing.

During layout or physical implementation 1324, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1326, the circuit function is verified at the layout level, which permits refinement of the layout design. During physical verification 1328, the layout design is checked to ensure that manufacturing constraints are correct, such as DRC constraints, electrical constraints, lithographic constraints, and that circuitry function matches the HDL design specification. During resolution enhancement 1330, the geometry of the layout is transformed to improve how the circuit design is manufactured.

During tape-out, data is created to be used (after lithographic enhancements are applied if appropriate) for production of lithography masks. During mask data preparation 1332, the 'tape-out' data is used to produce lithography masks that are used to produce finished integrated circuits.

A storage subsystem of a computer system (such as computer system 1400 of FIG. 14) may be used to store the programs and data structures that are used by some or all of the EDA products described herein, and products used for development of cells for the library and for physical and logical design that use the library.

Figure 14:
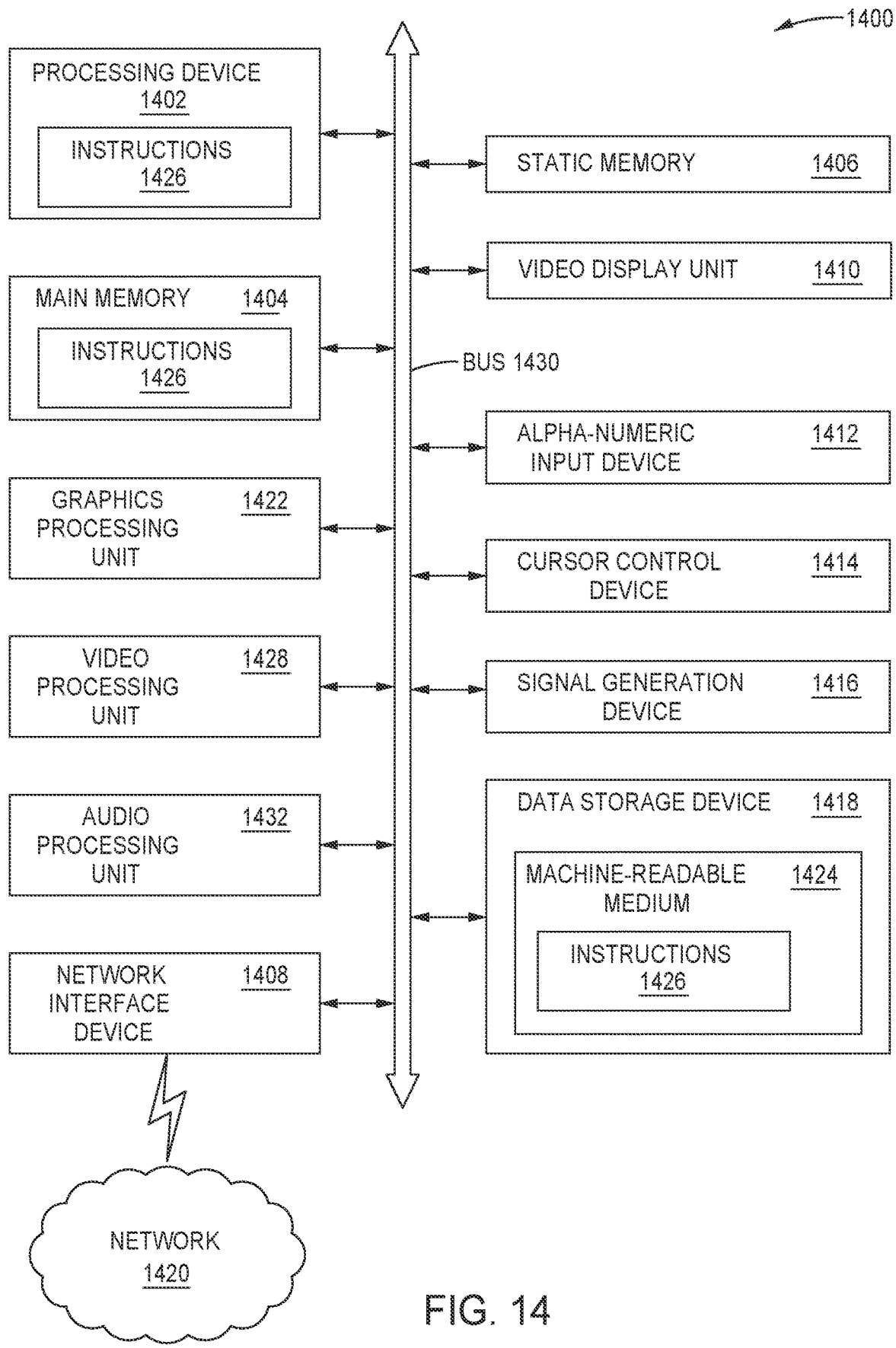
FIG. 14 depicts a diagram of an example computer system in which embodiments of the present disclosure may operate.

FIG. 14 illustrates an example machine of a computer system 1400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1400 includes a processing device 1402, a main memory 1404 (e.g., read-only memory (ROM), flash memory, dynamic random access memory (DRAM) such as synchronous DRAM (SDRAM), a static memory 1406 (e.g., flash memory, static random access memory (SRAM), etc.), and a data storage device 1418, which communicate with each other via a bus 1430.

Processing device 1402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. The processing device 1402 may be configured to execute instructions 1426 for performing the operations and steps described herein.

The computer system 1400 may further include a network interface device 1408 to communicate over the network 1420. The computer system 1400 also may include a video display unit 1410 (e.g., a liquid crystal display (LCD) or a cathode ray tube (CRT)), an alphanumeric input device 1412 (e.g., a keyboard), a cursor control device 1414 (e.g., a mouse), a graphics processing unit 1422, a signal generation device 1416 (e.g., a speaker), graphics processing unit 1422, video processing unit 1428, and audio processing unit 1432.

The data storage device 1418 may include a machine-readable storage medium 1424 (also known as a non-transitory computer-readable medium) on which is stored one or more sets of instructions 1426 or software embodying any one or more of the methodologies or functions described herein. The instructions 1426 may also reside, completely or at least partially, within the main memory 1404 and/or within the processing device 1402 during execution thereof by the computer system 1400, the main memory 1404 and the processing device 1402 also constituting machine-readable storage media.

In some implementations, the instructions 1426 include instructions to implement functionality corresponding to the present disclosure. While the machine-readable storage medium 1424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1402 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A system for forming a scan chain, the system comprising:
   a memory; and
   a processor communicatively coupled to the memory, the processor configured to:
      receive a circuit design comprising a plurality of scan cells, wherein the plurality of scan cells comprises a first scan cell and a first set of scan cells coupled logically to the first scan cell; and
      form the plurality of scan cells into a first scan chain such that the first set of scan cells are placed outside an extended neighborhood of the first scan cell, wherein the extended neighborhood of the first scan cell comprises (i) scan cells that are downstream of the first scan cell in the first scan chain and (ii) a scan cell that is adjacent to and upstream of the first scan cell in the first scan chain.

2. The system of claim 1, wherein the plurality of scan cells comprises a second scan cell and a second set of scan cells coupled logically to the second scan cell, wherein a third scan cell of the second set of scan cells is adjacent to and upstream of the second scan cell in the first scan chain, and wherein forming the plurality of scan cells into the first scan chain comprises adding an inverter between the third scan cell and the second scan cell.

3. The system of claim 1, wherein the plurality of scan cells comprises a second scan cell and a third scan cell, wherein forming the plurality of scan cells into the first scan chain comprises adding a multiplexer between the second scan cell and the third scan cell.

4. The system of claim 1, wherein forming the plurality of scan cells into the first scan chain comprises setting an order of the first set of scan cells in the circuit design.

5. The system of claim 1, wherein the processor is further configured to calculate a score for the first scan chain based on the first set of scan cells being placed outside the extended neighborhood of the first scan cell.

6. The system of claim 5, wherein the processor is further configured to select the first scan chain from a plurality of scan chains based on the score for the first scan chain.

7. The system of claim 5, wherein the score is based on a chain resolution of the first scan chain.

8. The system of claim 7, wherein the score is further based on at least one of wire length or power consumption in the circuit design.

9. A method of forming a scan chain, the method comprising:
   receiving a circuit design comprising a plurality of scan cells, wherein the plurality of scan cells comprises a first scan cell and a first set of scan cells coupled logically to the first scan cell; and
   forming, by a processor, the plurality of scan cells into a first scan chain such that the first set of scan cells are placed outside an extended neighborhood of the first scan cell, wherein the extended neighborhood of the first scan cell comprises (i) scan cells that are downstream of the first scan cell in the first scan chain and (ii) a scan cell that is adjacent to and upstream of the first scan cell in the first scan chain.

10. The method of claim 9, wherein the plurality of scan cells comprises a second scan cell and a second set of scan cells coupled logically to the second scan cell, wherein a third scan cell of the second set of scan cells is adjacent to and upstream of the second scan cell in the first scan chain, and wherein forming the plurality of scan cells into the first scan chain comprises adding an inverter between the third scan cell and the second scan cell.

11. The method of claim 9, wherein the plurality of scan cells comprises a second scan cell and a third scan cell, wherein forming the plurality of scan cells into the first scan chain comprises adding a multiplexer between the second scan cell and the third scan cell.

12. The method of claim 9, wherein forming the plurality of scan cells into the first scan chain comprises setting an order of the first set of scan cells in the circuit design.

13. The method of claim 9, further comprising calculating a score for the first scan chain based on the first set of scan cells being placed outside the extended neighborhood of the first scan cell.

14. The method of claim 13, further comprising selecting the first scan chain from a plurality of scan chains based on the score for the first scan chain.

15. The method of claim 13, wherein the score is based on a chain resolution of the first scan chain.

16. The method of claim 15, wherein the score is further based on at least one of wire length or power consumption in the circuit design.

17. A non-transitory computer readable medium storing instructions for forming a scan chain that, when executed by a processor, cause the processor to:
   receive a circuit design comprising a scan chain;
   determine a first scan cell of the scan chain and a second scan cell of the scan chain; and
   adjust an order of the scan chain such that the second scan cell is placed outside an extended neighborhood of the first scan cell, wherein the extended neighborhood of the first scan cell comprises (i) scan cells that are downstream of the first scan cell in the scan chain and (ii) a scan cell that is adjacent to and upstream of the first scan cell in the scan chain.

18. The medium of claim 17, wherein the instructions further cause the processor to:

determine a third scan cell of the scan chain and a fourth scan cell of the scan chain; and add an inverter between the third scan cell and the fourth scan cell.

19. The medium of claim 17, wherein the instructions further cause the processor to:

determine a third scan cell of the scan chain and a fourth scan cell of the scan chain; and add a multiplexer between the third scan cell and the fourth scan cell.

20. The medium of claim 17, wherein the instructions further cause the processor to calculate a score for the scan chain based on the second scan cell being placed outside the extended neighborhood of the first scan cell.

\* \* \* \* \*